(12) United States Patent
Guo et al.

(10) Patent No.: US 8,707,140 B2
(45) Date of Patent: Apr. 22, 2014

(54) APPARATUS AND METHOD FOR ERROR CORRECTION IN MOBILE WIRELESS APPLICATIONS INCORPORATING CORRECTION BYPASS

(75) Inventors: Scott Guo, San Jose, CA (US); Manikantan Jayaraman, San Jose, CA (US)

(73) Assignee: ST-Ericsson SA, Plan-les-Ouates (CH)

( * ) Notice: Subject to any disclaimer, the term of this patent is extended or adjusted under 35 U.S.C. 154(b) by 1100 days.

(21) Appl. No.: 12/067,071

(22) PCT Filed: Sep. 19, 2006
(Under 37 CFR 1.47)

(86) PCT No.: PCT/IB2006/053379
§ 371 (c)(1),
(2), (4) Date: Aug. 22, 2011

(87) PCT Pub. No.: WO2007/034417
PCT Pub. Date: Mar. 29, 2007

(65) Prior Publication Data
US 2012/0027098 A1    Feb. 2, 2012

Related U.S. Application Data

(60) Provisional application No. 60/718,893, filed on Sep. 19, 2005.

(51) Int. Cl.
*H03M 13/00* (2006.01)

(52) U.S. Cl.
USPC .............. 714/776; 714/52; 714/57; 714/704; 714/746; 714/798

(58) Field of Classification Search
USPC ................ 714/52, 57, 704, 746, 776, 798
See application file for complete search history.

(56) References Cited

U.S. PATENT DOCUMENTS

2006/0282749 A1 * 12/2006 Guo .............................. 714/776

FOREIGN PATENT DOCUMENTS

| GB | 2402307 A | 12/2004 |
|---|---|---|
| GB | 2407946 | 5/2005 |
| GB | 2 415 873 | 1/2006 |
| JP | 2009509480 | 3/2009 |
| WO | 2004079982 A1 | 9/2004 |
| WO | 2004086670 A1 | 10/2004 |

(Continued)

OTHER PUBLICATIONS

Balaguer, Edith, "Performance Evaluation of Power Saving Strategies for DVB-H Services using adaptive MPE-FEC Decoding", IEEE 2005 vol. 4, conference held Sep. 11-14, 2005.*

(Continued)

*Primary Examiner* — Sath V Perungavoor
*Assistant Examiner* — Jeffery Williams
(74) *Attorney, Agent, or Firm* — Potomac Patent Group PLLC (57) ABSTRACT

A device (102) supports error correction. A receiver (120) is configured to receive data over a communications link. A decapsulator (122) is coupled to the receiver and configured to create datagrams. A decoder (124) is coupled to the decapsulator and configured to store the datagrams in a table and to create codewords, the decoder storing the datagrams in table columns to create codewords in table rows. A user interface (126) is coupled to the decoder and configured to render images corresponding with the datagrams on the user interface. Advantages of the invention include efficient signal processing and prolonged battery life in mobile wireless devices.

6 Claims, 7 Drawing Sheets

(56) References Cited

FOREIGN PATENT DOCUMENTS

| WO | 2006/085326 | 8/2006 |
|---|---|---|
| WO | 2006/125157 | 11/2006 |
| WO | 2008/038067 | 4/2008 |

OTHER PUBLICATIONS

Joki, Heidi, "Modeling of DVB-H Link Layer," May 10, 2005, pp. 1-35, URL=http://www.netlab.tkk.fi/opetus/s38310/04-05/Kalvot_04-05/Joki_100505.ppt.

Joki, H; et al "Analysis of Reed-Solomon Coding Combined With Cyclic Redundancy Check in DVB-H Link Layer" Wireless Communication Systems, 2005. 2nd International Symposium On Siena, Italy, Sep. 5, 2005, pp. 313-317.

De Diego Balaguer, E; et al "Performance Evaluation of Power Saving Strategies for DVB-H Services Using Adaptive MPE-FEC Decoding" Personal, Indoor and Mobile Radio Communications, 2005. IEEE 16th International Symposium On Berlin, Germany, Sep. 11, 2005, pp. 2221-2226.

Koppelaar, A G C; et al "Restoration of IP-Datagrams in the DVB-H Link-Layer for TV On Mobile" Consumer Electronics, 2006. ICCE '06. 2006 Digest of Technical Papers. Jan. 7, 2006, pp. 409-410.

Eerenberg, O; et al "IP-Recovery in the DVB-H Link Layer for TV on Mobile" Consumer Electronics, 2006. ICCE '06. 2006 Digest of Technical Papers. Jan. 7, 2006, pp. 411-412.

* cited by examiner

FIG. 6 ns of transistors,
APPARATUS AND METHOD FOR ERROR CORRECTION IN MOBILE WIRELESS APPLICATIONS INCORPORATING CORRECTION BYPASS Wireless environments provide a challenge for high quality communication. The invention relates to techniques for improving error correction in mobile wireless applications while reducing memory, computational and power consumption requirements.

Advances in semiconductor manufacturing technologies and digital system architectures have resulted in very highly integrated circuits, which contain millions of transistors, along with various other components and interconnections. The integrated circuits that result from the aforementioned advances provide significant computational resources at relatively low costs. In turn, the availability of such integrated circuits has given rise to growth in the capabilities and varieties of consumer electronic products, and particularly mobile wireless products. One particular aspect of consumer electronic products is mobile and portable TV receivers.

Because of the ever-increasing demand for improved reception quality, more and more complex technologies have been employed in state-of-the-art mobile and portable TV receiver products that incorporate, or include, error correction functionality, or capability. Use of these complex technologies often results in undesirable consequences in terms of both cost and power consumption. For example, such signal processing capabilities typically require a large amount of memory in which to store input data, and further typically require fast computational resources. The extra memory and the high speed computational resources add to the cost and the power consumption of the products into which the error correction capabilities are incorporated.

The required amount of memory has become particularly large in some of the sophisticated processing algorithms that operate on large amount of input data and produce several output data, including intermediate results, which are stored for subsequent processing.

What is needed are methods and apparatus for providing error correction capabilities while reducing the cost and power consumption of products in which such capabilities are incorporated.

The invention provides an apparatus and method for improving the quality of reception in wireless devices.

An exemplary embodiment is a device that supports error correction. A receiver is configured to receive data over a communications link A decapsulator is coupled to the receiver and configured to create datagrams. A decoder is coupled to the decapsulator and configured to store the datagrams in a table and to create codewords, the decoder storing the datagrams in table columns to create codewords in table rows. A user interface is coupled to the decoder and configured to render images corresponding with the datagrams on the user interface. Advantages of the invention include the improve signal reception and prolong battery life in mobile wireless devices.

In one aspect of the invention, the decapsulator is configured to generate erasure attributes associated with the datagrams and the decoder is configured to store the erasure attributes in an erasure table. In one aspect of the invention, the decoder is configured to selectively process codewords to create corrected codewords, wherein the selection is based at least in part on the attributes stored in the erasure table. In one aspect of the invention, the decoder is configured to selectively bypass codewords that the erasure table identifies as correct or having too many errors to correct. In one aspect of the invention, the decapsulator is configured to generate at least three levels of erasure attributes associated with the datagrams.

Advantages of the invention include efficient signal processing and prolonged battery life in mobile wireless devices.

The invention is described with reference to the following figures.

The invention is described with reference to specific embodiments. Those skilled in the art will recognize that the description is for illustration and to provide the best mode of practicing the invention. While references are made to specific wireless devices and protocols, the invention is applicable to many different types of communication mediums, devices and protocols. For example, while a wireless protocol is described herein, the invention is applicable to other protocols and communication techniques such as wireline communication, as well as analog and digital variations. Likewise, while Reed-Solomon error correction is described, other error correction techniques can be implemented in the invention.

Figure 1:
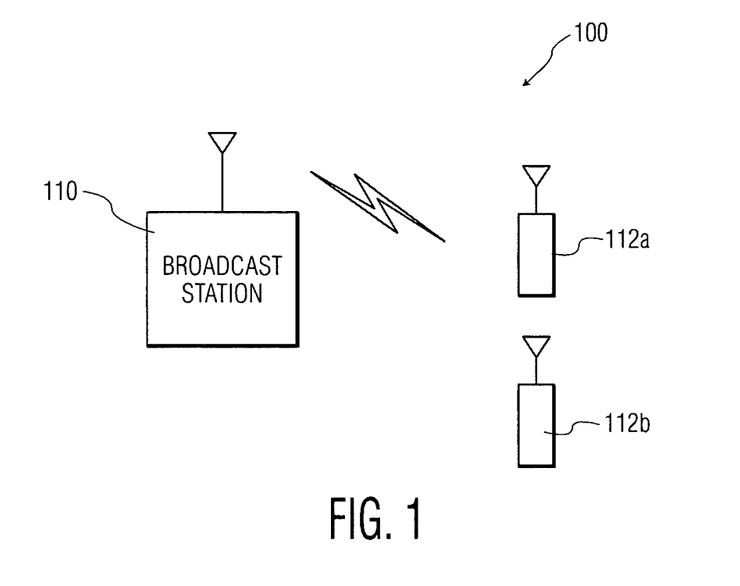
FIG. 1 depicts an exemplary wireless network according to an embodiment of the invention.

FIG. 1 depicts an exemplary wireless network 100 showing a broadcast station 110 and a number of wireless devices 112a-112b receiving a signal from the broadcast station. These devices have the ability to communicate with one another. The devices 112a-112b are, for example, television receivers, but could also be other mobile devices such as telephones, personal digital assistants (PDAs), laptop computers or other electronic devices. Moreover, some of these devices may be on battery power while others may be powered by an available power outlet. In some cases, the devices can also be connected to the network through a wired network e.g. Ethernet or cable connection.

Figure 2A:
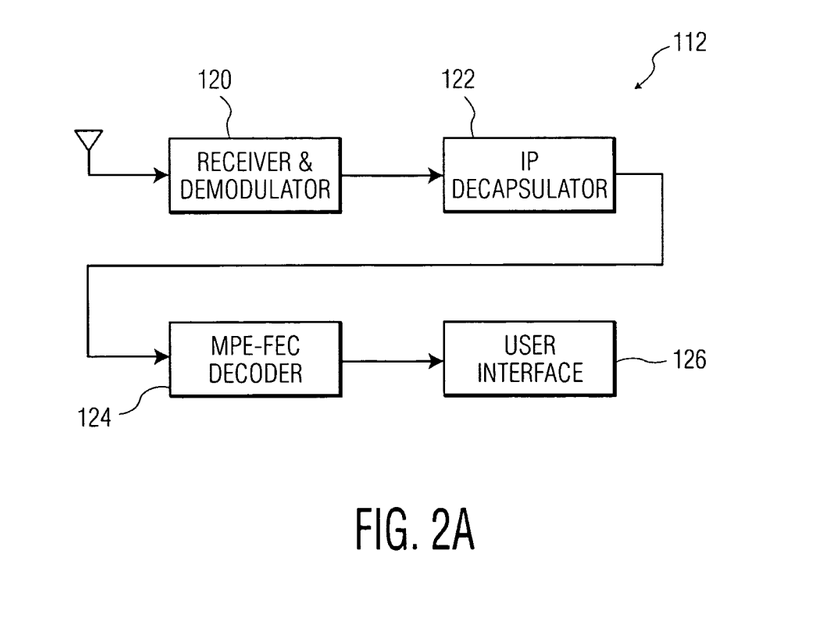
FIG. 2A depicts an exemplary device according to an embodiment of the invention.
Figure 2B:
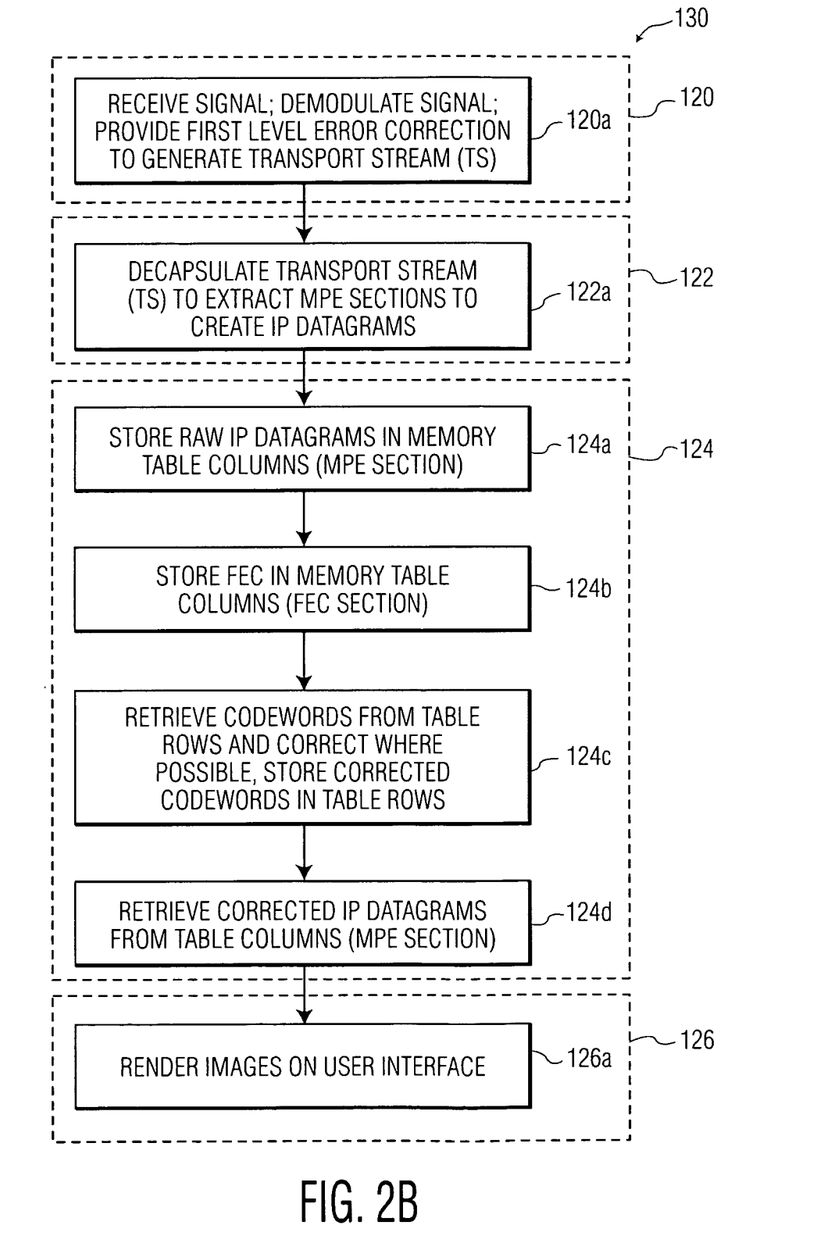
FIG. 2B depicts a flowchart showing methods performed in the exemplary device according to an embodiment of the invention.

FIG. 2A depicts an exemplary device 112 according to an embodiment of the invention. FIG. 2B depicts a flowchart showing methods performed in the exemplary device. A receiver and demodulator 120 receives an inbound signal, transforms the signal to a lower frequency, and creates a Transport Stream to make the signal available for processing. In one aspect, the receiver includes an error correction circuit that performs initial error correction on the demodulated packets and sets a Transport Error Indicator (TEI) if the TS packet is bad and cannot be corrected. An IP Decapsulater 122 performs initial processing on transport packets by decoding the inbound information into multi-protocol encapsulation forward error correction (MPE-FEC) sections along with erasure information, and parsing through the MPE-FEC sections to extract the raw IP datagrams. An MPE-FEC decoder 124 receives the MPE-FEC sections and processes the Reed-Solomon codewords according to embodiments of the invention, resulting in corrected IP datagrams. A user interface 126, e.g. source decoding and rendering circuit, processes the information for display on a user interface, e.g. television display.

For error correction, an exemplary embodiment uses Reed-Solomon codes. A Reed-Solomon encoder takes a block of digital data and adds extra "redundant" bits. Errors occur during transmission or storage for a number of reasons (for example noise or interference, scratches on a CD, etc). The Reed-Solomon decoder processes each block and attempts to correct errors and recover the original data. The number and type of errors that can be corrected depends on the characteristics of the Reed-Solomon code.

A Reed-Solomon code is specified as RS (n, k) with s-bit symbols. This means that the encoder takes k data symbols of s bits each and adds parity symbols to make an n symbol codeword. These are n–k parity symbols of s bits each. A Reed-Solomon decoder can correct up to t symbols that contain errors in a codeword, where 2t=n–k.

Figure 3A:
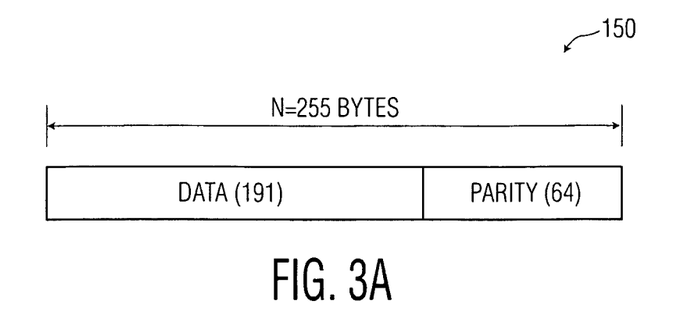
FIG. 3A depicts a Reed-Solomon codeword according to an embodiment of the invention.

FIG. 3A depicts a Reed-Solomon codeword according to an embodiment of the invention. The Reed-Solomon codes used in the MPE-FEC is specified as RS (255, 191) with 8-bit symbols. This means that each codeword contains 255 code word bytes, of which 191 bytes are data and 64 bytes are parity. That is: n=255, k=191, s=8, 2t=64 and t=32. The decoder can correct any 32 symbol errors in the code word: i.e., errors in up to 32 bytes anywhere in the codeword can be automatically corrected. Given a symbol size s, the maximum codeword length n for a Reed-Solomon code is n=2s−1. For example, the maximum length of a code with 8-bit symbols (s=8) is 255 bytes. The amount of processing power required to encode and decode Reed-Solomon codes is related to the number of parity symbols per codeword. A large value of t means that a large number of errors can be corrected but requires more computational power than a small value of t. One symbol error occurs when any number of bits in a symbol are wrong.

Reed-Solomon algebraic decoding procedures can correct errors and erasures. An erasure occurs when the position of an erred symbol is known. A decoder can correct up to t errors or up to 2t erasures. In the exemplary embodiment, erasure information is estimated and manipulated to assist in identifying received symbols that are likely to contain errors. When a codeword is decoded, if 2x+y<2t (x errors, y erasures) then the original transmitted codeword can be recovered.

It is noted that the more erasures are known, the more errors can be corrected. Therefore, it is desirable that as many erasure as possible (up to 64, of course) can be identified prior to Reed-Solomon decoding. On the other hand, if symbols are wrongly marked as erasures, it will reduce the number of errors that Reed-Solomon decoder can correct. For example, suppose that there are 8 erasures, of which 6 are not error codes and are hence wrongly identified as erasures. The Reed-Solomon decoder can only correct (64−8)/2=28 errors and 2 erasures. On the other hand, if there are only 2 erasures identified in the first place, Reed-Solomon can then correct (64−2)/2=31 errors and 2 erasures. Therefore, it is desirable to provide a sound algorithm to reliably mark erasures.

Figure 3B:
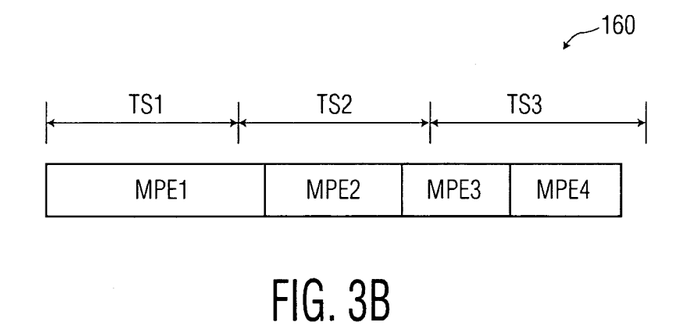
FIGS. 3B-C depict the relationship between the transport packets and the MPE-FEC sections according to an embodiment of the invention.
Figure 3C:
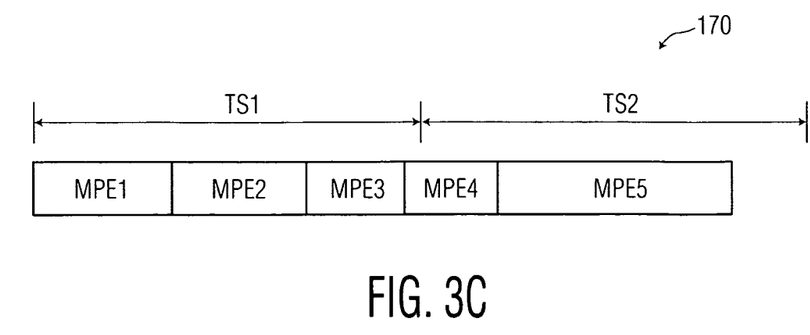

FIGS. 3B-C depicts the relationship between the transport packets and the MPE-FEC packets according to an embodiment of the invention (not to scale). The formats for the transport stream (TS) packet and the datagram section are shown in Table 1 and Table 2, respectively. Note in FIG. 3A that there does not need to be a direct correspondence between the TS packet and the MPE packet, and an MPE packet can cross the boundary between one or more TS packets. One aspect of the invention is how to reconcile and reconstruct the MPE-FEC table 400 shown in FIG. 4A under all conditions.

TABLE 1

Transport packet format (in the order in which they appear in the transport packet. The first row, i.e. sync byte occurs first).

| Name | Number of bits | Description |
| --- | --- | --- |
| Sync byte | 8 | Fixed value of 0x47. |
| Transport error indicator (TEI) | 1 | A value of '0' indicates no error. A value of '1' indicates that at least 1 bit error in the transport packet. |
| Payload unit start indicator (PUSI) | 1 | A value of '1' indicates there is at least an MPE section header in the payload of this transport packet. A value of '0' indicates there is no MPE section header in the payload of this transport packet. |
| Transp. priority | 1 | |
| PID | 13 | 0x0000: PAT; 0x0001: CAT; 0x0010-0x1FFFE: network, program map-, elementary-PID or other. 0x1FFF: null. |
| Transport scrambling control | 2 | 00 |
| Adaptation field control | 2 | 00: reserved; 01: no adapt field, payload only; 10: adapt field only, no payload; 11: adapt field and payload. |
| Continuity counter | 4 | |
| Adaptation field | 0 or 8 | Adaptation + stuffing |
| Payload | 183 or 184 | PES packets or PSI sections or packet stuffing bytes or private data. |

TABLE 2

MPE section format.

| Name | Number of bits | Description |
|---|---|---|
| Table ID | 8 | 0x3E indicates DSM CC section with private data (table 9-3 in ISO/IEC 138 18-6) |
| Section syntax indicator | 1 | 1: presence of CRC_32 field. |
| Private indicator | 1 | 0 |
| Reserve | 2 | 11 |
| Section length | 12 | The number of remaining bytes in the MPE section immediately following this field up to the end of the MPE section. |
| MAC address (bytes 6 and 5) | 16 | |
| Reserve | 2 | |
| Payload scrambling control | 2 | 00 |
| Address scrambling control | 2 | 00 |
| LLC SNAP flag | 1 | A value of '0' indicates that section carries an IP datagram without LLC SNAP encapsulation (mandated by IP datacast docs) |
| Current next indicator | 1 | Always 1. |
| Section number | 8 | 0: no fragmentation of payload over multiple MPE sections<br>1 . . . 255: fragment sequence number. |
| Last section number | 8 | Sequence number of the section carrying the last payload fragment. |
| MAC address (bytes 4 to 1) | 32 | |
| Data payload (IP datagram) | | |
| Section stuffing bytes | | |
| CRC_32 | | |

Figure 4A:
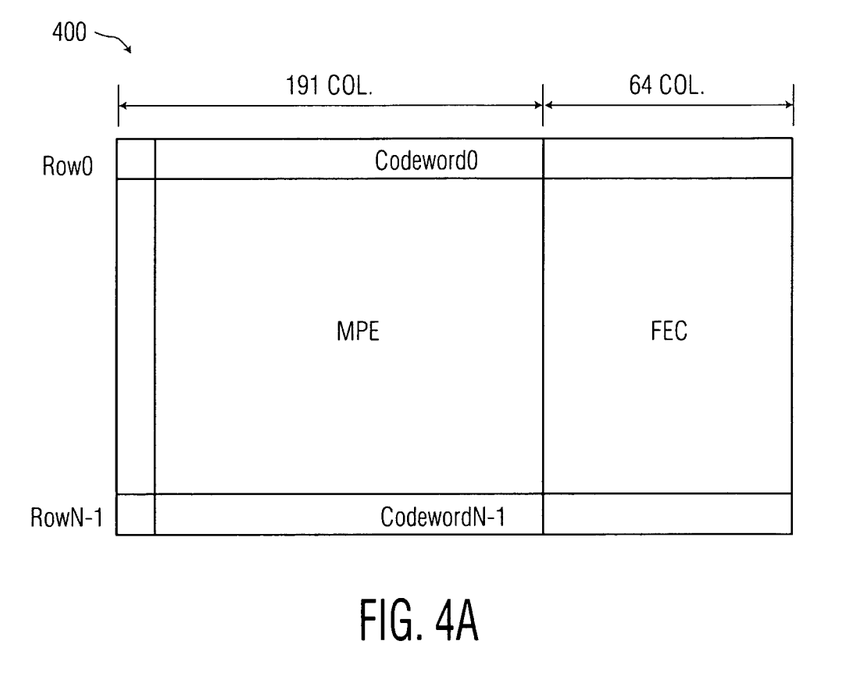
FIGS. 4A-B depict a memory table according to an embodiment of the invention.
Figure 4B:
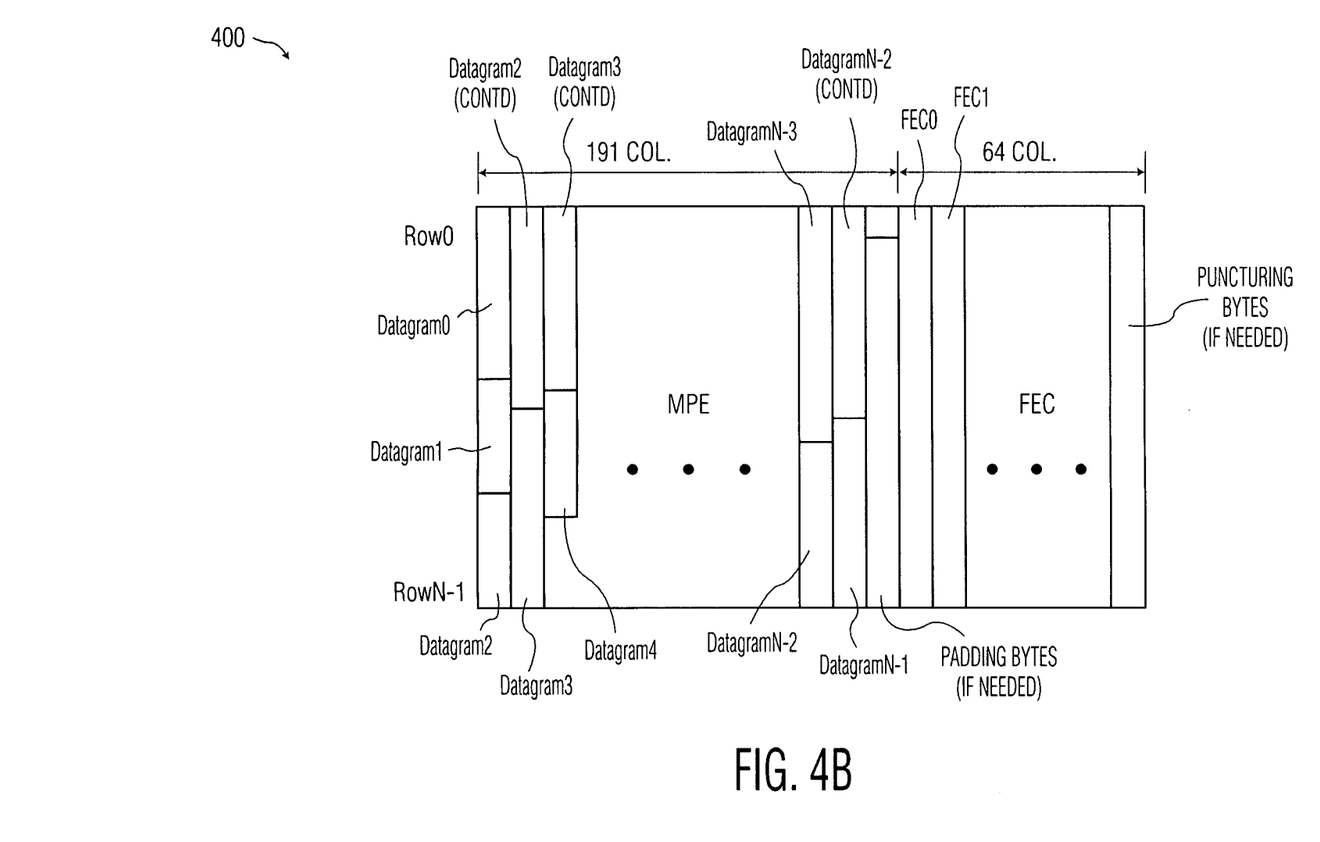

FIGS. 4A-B depict a memory table 400 according to an embodiment of the invention. The memory table includes a number of columns corresponding to the length of the desired codeword, which in this case is N=255 Bytes. The table includes a number of rows corresponding with the desired size of the table in memory.

FIG. 4A shows an MPE portion and a FEC portion of the memory 400 for each codeword to be reconstructed by the invention. FIG. 4B shows how the IP datagrams are received and compiled into columns of the table 400. The MPE portion can include padding bytes that are transmitted in the TS to fill the portion of the table, which may occur at a variable length since the MPE section lengths are variable. The FEC section packets are normally full length since they are intended to be inserted into the FEC portion of the table as efficiently as possible. The FEC portion can include puncturing bytes, which are not transmitted, to fill the FEC portion of the table.

Figure 4C:
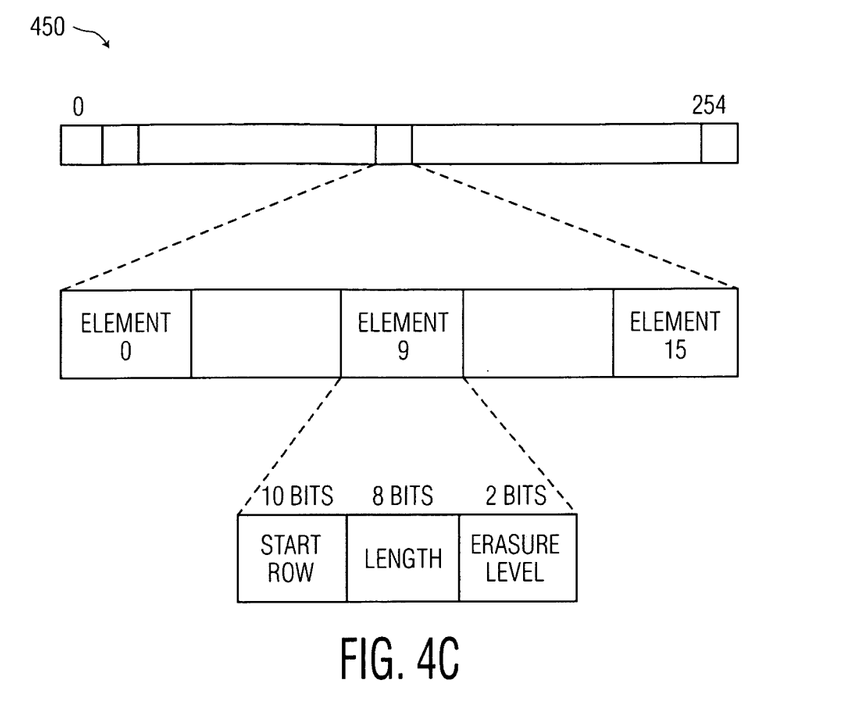
FIG. 4C depicts an erasure table according to an embodiment of the invention.

FIG. 4C depicts an erasure table according to an embodiment of the invention. One aspect of the invention is that the decapsulator is configured to generate erasure attributes associated with the datagrams and the decoder is configured to store the erasure attributes in an erasure table. The decoder is configured to selectively process codewords to create corrected codewords, wherein the selection is based at least in part on the attributes stored in the erasure table. The decoder is configured to selectively bypass codewords that the erasure table identifies as correct or uncorrectable.

In one aspect, the decapsulator is configured to generate at least three levels of erasure attributes associated with the datagrams as shown in Table 3. In this aspect, the decoder is configured to selectively process codewords to create corrected codewords, wherein the selection is based at least in part on the attributes stored in the erasure table. Again, the decoder is configured to selectively bypass codewords that the erasure table identifies as correct or having too many errors to correct. In this aspect, a concept of soft-erasures is introduced. A soft-erasure describes the likelihood of a symbol in a codeword being erroneous.

TABLE 3

Soft-Erasure Attributes

| Soft-Erasure Value | Description |
|---|---|
| 0 (00) | The probability of the symbol being erroneous is 0. |
| 1 (01) | The probability of the symbol being erroneous is less than 0.5. |
| 2 (10) | The probability of the symbol being erroneous is more than 0.5. |
| 3 (11) | The probability of the symbol being erroneous is 1. |

The soft-erasure value of each symbol in the codeword can be extracted, for example, from the received transport packet. For instance, if the TEI (transmission error indicator) bit of the transport packet is set to 1, the soft-erasure value of the payload in the transport packet can be assigned to 2, while the soft-erasure value is assigned to 1 if the TEI bit is set to 0. For padding bytes of the MPE application data table, or payload of the transport packets that pass CRC (cyclic redundancy checksum) check, for example, a soft-erasure value of 0 is assigned. For puncturing bytes of the MPE-FEC Reed-Solomon data table, for example, a soft-erasure value of 3 is assigned.

These examples show how the soft-erasure values may be determined. Other scenarios are possible for the soft-erasure value. For instance, the continuity count bits of a transport packet can be used to determine whether there are any packets dropped. In case a packet is dropped, the soft-erasure value of the whole packet can be assigned to 3, as it is certain that all symbols are erroneous.

While there are a number of techniques to construct the soft-erasure table, it is useful that the table be constructed in such a way that hard-erasures can be generated for each codeword and to minimize the table size. A simplified hard-erasure generator and small soft-erasure table translate to reduced cost and power consumption.

In one aspect of the current invention, hard-erasures are generated after the MPE-FEC frame is completely constructed and the soft-erasure table is filled. Hard-erasure value is binary. When its value is 1, it indicates the current symbol of the codeword is an erasure. When its value is 0, it indicates that the current symbol of the codeword is not an erasure. The hard-erasure is subsequently used by the Reed-Solomon decoder. The present invention, however, is not limited to a specific Reed-Solomon decoder implementation.

The hard-erasure generator is normally related to how the soft erasure table is constructed. In one aspect of the current invention, the hard-erasure generator produces hard-erasures for one complete codeword per execution. At the end of an execution, the hard-erasure generator determines that no Reed-Solomon decoding is necessary if either of the following conditions is met: (a) the hard-erasure of every symbol in the codeword is 0; or (b) the number of symbols whose hard-erasure is 1 exceeds the limitation of the Reed-Solomon decoder, i.e. 64 in the case of DVB-GH (digital video broadcasting-handhelds). Normally, the first condition is met if and only if the soft-erasures of all symbols in a codeword are 0, and the second condition is met if and only if the soft-erasures of at least 65 (in the case of DVB-H) symbols in a codeword are not 0.

Note that the present invention also works with Reed-Solomon decoding that does not use erasures. In that case, the sole function of the hard-erasure generator is to determine whether or not Reed-Solomon Decoding is required. No hard-erasures are output to the Reed-Solomon decoding sub-module.

Figure 5:
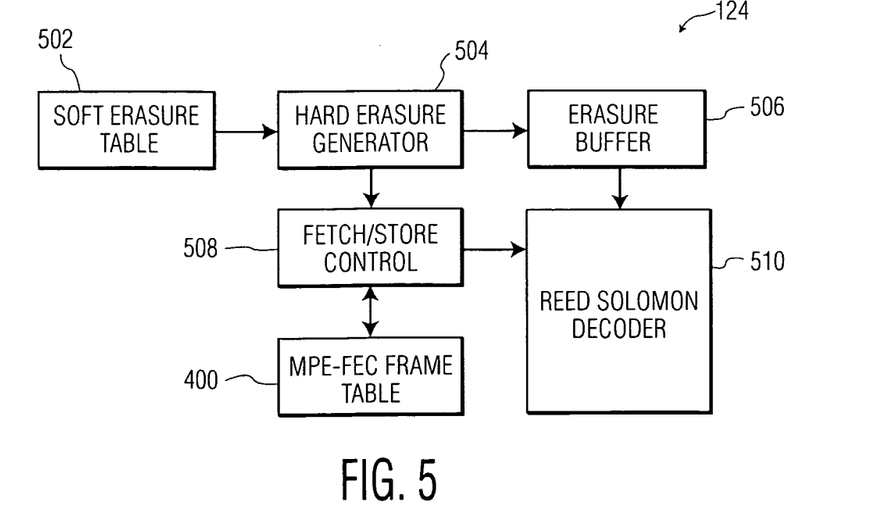
FIG. 5 depicts a logical architecture of the adaptive MPE-FEC decoder according to an embodiment of the invention FIG. 6 depict a flowchart according to an embodiment of the invention.

FIG. 5 depicts a logical architecture of the adaptive MPE-FEC decoder 124 according to an embodiment of the invention. It includes the following major components or sub-modules. A Reed-Solomon decoder 510 corrects the Reed-Solomon coded codewords. The Reed-Solomon decoder can either use erasures or not, depending on the desired aspect of the invention. MPE-FEC frame table 400 is where the MPE-FEC table (including MPE application data table and Reed-Solomon data table) is stored. Hard-erasure generator 504 generates hard-erasures and determines whether or not Reed-Solomon decoding is useful for a codeword. Fetch/store control 508 is responsible for selectively fetching an un-corrected codeword and storing back the corrected codeword. Control 508 is controlled by the hard-erasure generator as to whether skip one or more codeword. In case the Hard-erasure generator determines that no Reed-Solomon decoding is selected for a codeword, the fetch of the codeword is skipped. Erasure buffer 506 stores the erasures generated by the hard-erasure generator. Soft-erasure table 502 stores soft-erasure information that is extracted from transport packets.

Figure 6:
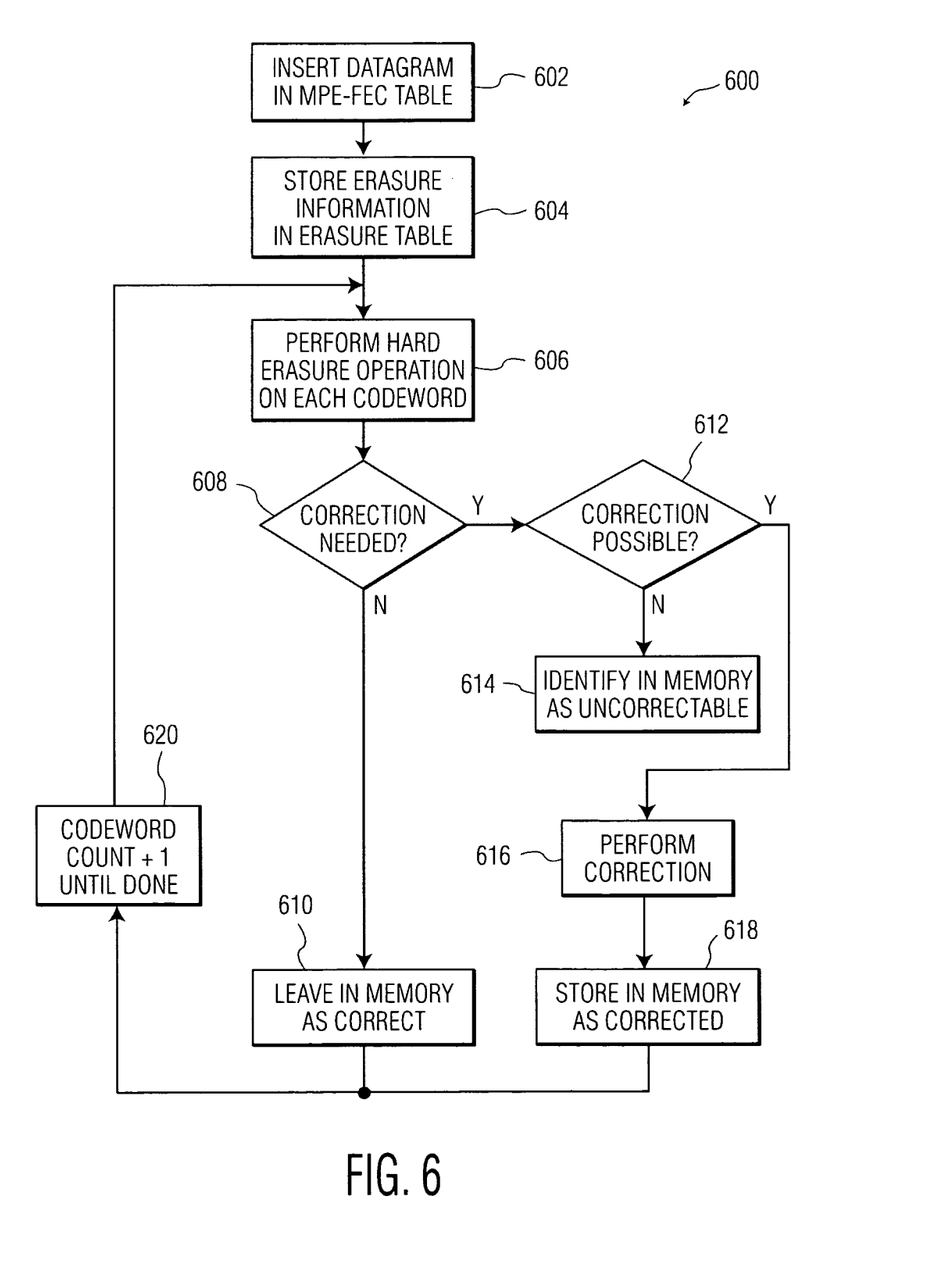

FIG. 6 depicts a flowchart 600 showing an adaptive forward error correction method according to an embodiment of the invention. In step 602, the MPE-FEC frame is constructed by decapsulating IP datagrams from transport packets received from the receiver 120. As part of the decapsulation process, step 604 constructs a soft-erasure table that describes the error likelihood of each symbol in the MPE-FEC frame. When the MPE-FEC frame and soft-erasure table are completed, step 606 performs the hard-erasure operation on each codeword of the MPE-FEC frame table.

At the end of the hard-erasure generation of a codeword, in step 608, the hard-erasure generator determines whether Reed-Solomon decoding is required for the given codeword. If correction is not required, the current codeword is not fetched from the MPE-FEC frame and no Reed-Solomon decoding is performed. Step 610 leaves the codeword in memory as corrected.

If correction of the codeword is needed, step 612 determines whether correction is possible. If there are too many errors to correct the codeword, then step 614 identifies the codeword as uncorrectable. If the codeword can be corrected, then step 616 performs the correction and step 618 stores the codeword in memory as corrected.

In step 620, the hard-erasure generator then starts to work on the next codeword in this case. The process continues till the whole MPE-FEC frame is processed The present invention is based on an insight that for a given MPE-FEC frame, it may not be necessary to correct every codeword. In case there is no error or there are too many errors, Reed-Solomon decoding can be bypassed to shorten processing time and avoid unnecessary memory access. Shortened processing time means that the MPE-FEC operation can be completed earlier than otherwise, and the whole system, a TV receiver for example, can be put into sleep mode. This is especially desirable for a DVB-H based TV receiver, where time-slicing is a key feature that allows the receiver to work in burst mode. Reduced memory access means less clock toggling than otherwise.

In both cases, power consumption of the system can be reduced.

In the example of a mobile TV receiver, a good reception condition implies that there are fewer or no errors, while a bad reception condition means there are too many errors. The present invention can thus save power in both good and bad reception conditions.

Advantages of the invention include efficient signal processing and prolonged battery life in mobile wireless devices.

Having disclosed exemplary embodiments and the best mode, modifications and variations may be made to the disclosed embodiments while remaining within the subject and spirit of the invention as defined by the following claims.

What is claimed is:

1. A device supporting error correction, comprising:
   a receiver configured to receive data over a communications link;
   a decapsulator coupled to the receiver and configured to create datagrams;
   a decoder coupled to the decapsulator and configured to store the datagrams in a table and to create codewords, the decoder storing the datagrams in table columns to create codewords in table rows; and
   a user interface coupled to the decoder and configured to render images corresponding with the datagrams on the user interface;
   wherein the decapsulator is configured to generate at least three levels of erasure attributes associated with the datagrams providing soft erasures which describe a likelihood of a symbol in a codeword being erroneous, and the decoder is configured to store the erasure attributes in an erasure table, and to selectively bypass codewords that the erasure table identifies as correct and codewords having too many errors to correct, and the decapsulator sets soft erasure values for describing the likelihood of a symbol in a codeword being erroneous according to:

0(00), wherein a probability of the symbol's being erroneous is 0;

1(01), wherein the probability of the symbol's being erroneous is less than 0.5;

2(10), wherein the probability of the symbol's being erroneous is more than 0.5; and 3(11), wherein the probability of the symbol's being erroneous is 1.

2. The device of claim 1, wherein the communications link is a wireless link and the data is digital television data.

3. A method of processing error correction, comprising:
receiving data over a communications link;
decapsulating the data to create datagrams;
decoding the datagrams by storing the datagrams in a table and to create codewords, including the steps of
storing the datagrams in table columns to create codewords in table rows; and
rendering images on a user interface corresponding with the datagrams on the user interface;
wherein the decapsulating includes generating at least three levels of erasure attributes associated with the datagrams providing soft erasures which describe a likelihood of a symbol in a codeword being erroneous, and decoding includes storing the erasure attributes in an erasure table, and selectively bypassing codewords that the erasure table identifies as correct and codewords having too many errors to correct, and the decapsulating includes setting soft erasure values for describing the likelihood of a symbol in a codeword being erroneous according to:

0(00), wherein a probability of the symbol's being erroneous is 0;

1(01), wherein the probability of the symbol's being erroneous is less than 0.5;

2(10), wherein the probability of the symbol's being erroneous is more than 0.5; and 3(11), wherein the probability of the symbol's being erroneous is 1.

4. The method of claim 3, wherein the communications link is a wireless link and the data is digital television data.

5. The device of claim 1, wherein the decoder is configured to selectively bypass codewords if all symbols in the codeword have a soft erasure value of 0(00), or if a number of symbols in the codeword having a soft erasure value that is not 0(00) exceeds a limitation of the decoder.

6. The method of claim 3, wherein decoding includes selectively bypassing codewords if all symbols in the codeword have a soft erasure value of 0(00), or if a number of symbols in the codeword having a soft erasure value that is not 0(00) exceeds a limitation of the decoder.

* * * * *